United States Patent
Aoki

(10) Patent No.: US 7,720,119 B2
(45) Date of Patent: May 18, 2010

(54) LASER CIRCUIT SUBSTRATE

(75) Inventor: Takashi Aoki, Urayasu (JP)

(73) Assignee: Canon Kabushiki Kaisha, Tokyo (JP)

( * ) Notice: Subject to any disclaimer, the term of this patent is extended or adjusted under 35 U.S.C. 154(b) by 57 days.

(21) Appl. No.: 12/202,773

(22) Filed: Sep. 2, 2008

(65) Prior Publication Data

US 2009/0010289 A1    Jan. 8, 2009

Related U.S. Application Data

(62) Division of application No. 11/300,877, filed on Dec. 14, 2005, now Pat. No. 7,436,869.

(30) Foreign Application Priority Data

Dec. 16, 2004  (JP) .............................. 2004-364773
Nov. 10, 2005  (JP) .............................. 2005-326594

(51) Int. Cl.
*H01S 3/00* (2006.01)

(52) U.S. Cl. ................ 372/38.02; 372/38.1; 372/38.04; 372/38.07

(58) Field of Classification Search ................ 372/38.1, 372/38.02, 38.04
See application file for complete search history.

(56) References Cited

U.S. PATENT DOCUMENTS

| | | | | |
|---|---|---|---|---|
| 3,986,117 A * | 10/1976 | Fry et al. | ..................... | 324/133 |
| 4,838,032 A * | 6/1989 | Maslaney et al. | ............. | 62/3.7 |
| 5,430,749 A | 7/1995 | Horie | ........................... | 372/38 |
| 6,075,211 A | 6/2000 | Tohya et al. | ................. | 174/255 |
| 6,711,189 B1 * | 3/2004 | Gilliland et al. | .......... | 372/38.02 |

FOREIGN PATENT DOCUMENTS

| | | |
|---|---|---|
| JP | 63-44782 | 2/1988 |
| JP | 7-154015 | 6/1995 |
| JP | 9-139573 | 5/1997 |
| JP | 2001-358661 | 12/2001 |
| JP | 2004-14704 | 1/2004 |
| JP | 2004-95905 | 3/2004 |

OTHER PUBLICATIONS

Japanese Official Communication dated Jun. 5, 2009, regarding Japanese Application No. 2005-326594.

* cited by examiner

*Primary Examiner*—Dung T Nguyen
(74) *Attorney, Agent, or Firm*—Fitzpatrick, Cella, Harper & Scinto

(57) ABSTRACT

This invention makes it possible to meet a requirement of high-quality image printing and high-speed driving of a semiconductor laser driver in a laser beam printer or the like while suppressing radiant noise. A laser circuit substrate includes a first wiring pattern and second wiring pattern connected to a main wiring pattern, a first circuit which is connected to the first wiring pattern and has a semiconductor laser element and a driving circuit for driving the semiconductor laser element, a second circuit which is connected to the second wiring pattern and compensates noise generated by the first circuit, a first capacitor which is connected to a first point in the first wiring pattern, and a second capacitor which is connected to a second point in the second wiring pattern. The positions of the first point and second point are set such that the sum of the impedances of the first wiring pattern and first circuit viewed from the first point, and the sum of the impedances of the second wiring pattern and second circuit viewed from the second point are substantially equal to each other.

3 Claims, 9 Drawing Sheets t=35 [μm]
h=1.43 [mm]
w=2.7 [mm]
εr=4.3
σ=5.8e+07 [S/m]

LASER CIRCUIT SUBSTRATE

This is a divisional application of prior application Ser. No. 11/300,877, filed Dec. 14, 2005, to which priority under 35 U.S.C. §120 is claimed. This application also claims priority from Japanese Patent Application Nos. 2004-364773 (filed on Dec. 16, 2004) and 2005-326594 (filed Nov. 10, 2005) the entire contents of which are incorporated herein by reference.

FIELD OF THE INVENTION

The present invention relates to a laser circuit substrate on which a driver for a semiconductor laser to be used as a light source for printing in an image forming apparatus is mounted.

BACKGROUND OF THE INVENTION

Currently, there is demand for an image forming apparatus that executes high-speed and high-quality image printing. Accordingly, there is also demand to increase the driving frequency of semiconductor laser elements of a semiconductor laser driver in a laser beam printer or the like and to also increase the number of semiconductor laser elements.

Generally, a laser circuit substrate is made up of a semiconductor laser element and driving semiconductor device which form a semiconductor laser driving circuit (light-emitting circuit), main power transmission wiring, main ground wiring, and wiring which connects the semiconductor laser element to the driving semiconductor device. The light-emitting circuit for outputting a semiconductor laser beam supplies, to the semiconductor laser element, a current of about several tens of mA at a frequency of about 10 MHz to blink the semiconductor laser element, thereby converting a received electrical data signal into an optical data signal. However, when a large current flows through the semiconductor laser driver at a high frequency, noise currents are generated in the light-emitting circuit due to the differences among the impedances of the semiconductor laser elements, driving semiconductor device, main power transmission wiring, main ground wiring, and the wiring which connects the semiconductor laser element to the driving semiconductor device. The generated noise currents propagate to main wiring such as the main power transmission wiring and main ground wiring, and noise currents are also generated even in the main wiring.

Such a noise current deteriorates the quality of a light emitting current supplied from the semiconductor laser element, so demanded high-quality image printing is hindered. If the main wiring is principally connected to a power supply cable, radiant noise is inconveniently produced when the power supply cable acts as an antenna. Furthermore, if the power supply cable shares GND (ground) with other signal cables, radiant noise is inconveniently produced since the noise currents also flow in the other signal cables.

Japanese Patent Laid-Open No. 63-044782 discloses a method of suppressing the occurrence of noise currents which hinder high-quality image printing and generate radiant noise. In this conventional method, a filter is arranged on wiring which connects a semiconductor laser element to a driving semiconductor device. Unfortunately, as driving frequency increases, the deterioration of the light-emitting current waveform caused by filter insertion worsens. For this reason, high-speed, high-quality image printing, and radiant noise reduction cannot be attained simultaneously.

In recent years, to suppress noise currents, a compensation circuit is generally added to a circuit substrate. FIG. 9 shows an example of the circuit substrate with the compensation circuit.

A compensation circuit 10 which is made up of a compensation element 11, wiring 12, and compensation semiconductor device 13 is connected in parallel with a light-emitting circuit 6 from main power transmission wiring 2 made up of a semiconductor laser element 7, wiring 8, and driving semiconductor device 9. With this arrangement, the compensation circuit 10 and light-emitting circuit 6 are complementarily driven, thus implementing a compensation function of allowing a feed capacitor 1 to supply a constant current. Since a constant current flows through the main power transmission wiring 2, noise currents which normally flow through the main power transmission wiring 2 can be suppressed. In addition, noise currents generated in the light-emitting circuit 6 are canceled by a compensation current flowing through the compensation circuit at a branch point 3 of first wiring 4 (4a and 4b) and second wiring 5 (5a and 5b). This makes it possible to suppress propagation of the noise currents to the main wiring side.

When such a constant current driving arrangement is to be adopted, ideally, a wiring form must be designed such that an impedance Z4 of the wiring 4 becomes equal to an impedance Z5 of the wiring 5. The values of the impedances Z4 and Z5 can be equalized by using the wiring 4 and wiring 5 of the same length. Alternatively, the difference between the impedances Z4 and Z5 can be decreased by making their length as short as possible.

However, the position of the semiconductor laser element is determined mainly in consideration of the position of an optical system suitable for processing a laser beam output from the semiconductor laser element. Therefore, the degree of freedom of wiring is largely limited to meet a requirement of high-quality image printing.

Although one or two semiconductor laser elements per color are conventionally used, four semiconductor laser elements are becoming necessary to meet the requirement of high-quality image printing. With the increase in the number of semiconductor laser elements, a larger number of parts and wiring should be arranged on the laser circuit substrate. On the other hand, the optical axis of a laser beam is stabilized by fixing the laser circuit substrate to a metal housing around it. For this reason, when a substrate with a larger size is adopted in order to increase the degree of freedom of wiring, the vibration resistance decreases, so the optical axis readily shifts. The requirement of high-quality image printing cannot then be satisfied.

Hence, it is becoming very difficult for the laser circuit substrate to take the wiring form which employs wiring 4 and wiring 5 having the same length, or makes their length as small as possible.

In the wiring form shown in FIG. 9, the value of an impedance Z6 of the light-emitting circuit 6 is slightly different from that of an impedance Z10 of the compensation circuit 10. This difference takes a value small enough at a driving frequency of about 10 MHz and does not cause serious problems. However, it readily causes problematic noise currents under the present circumstance in which high-speed driving up to a driving frequency of about 60 MHz is desired. The requirement of printing at a high driving frequency cannot be sufficiently satisfied.

SUMMARY OF THE INVENTION

The present invention has been made in consideration of the above problem, and has as its object to meet a requirement of high-quality image printing and high-speed driving of a semiconductor laser driver in a laser beam printer or the like while suppressing radiant noise.

In order to solve the above problem and achieve the above object, according to the present invention, there is provided a laser circuit substrate comprising a main power transmission wiring pattern, a ground wiring pattern, a first wiring pattern and second wiring pattern which are connected in parallel with each other from the main power transmission wiring pattern, a first circuit which is connected between the first wiring pattern and ground wiring pattern and has a semiconductor laser element and a driving circuit for driving the semiconductor laser element, a second circuit which is connected between the second wiring pattern and ground wiring pattern and compensates noise generated by the first circuit, a first capacitor connected to a first point at which the first wiring pattern is divided into a third wiring pattern and fourth wiring pattern from a first circuit side, and a second capacitor connected to a second point at which the second wiring pattern is divided into a fifth wiring pattern and sixth wiring pattern from a second circuit side, wherein positions of the first point and second point are set such that a sum of impedances of the first circuit and third wiring pattern viewed from the first point is substantially equal to a sum of impedances of the second circuit and fifth wiring pattern viewed from the second point.

Other objects and advantages besides those discussed above shall be apparent to those skilled in the art from the description of a preferred embodiment of the invention which follows. In the description, reference is made to accompanying drawings, which form a part hereof, and which illustrate an example of the invention. Such example, however, is not exhaustive of the various embodiments of the invention, and therefore reference is made to the claims which follow the description for determining the scope of the invention.

DETAILED DESCRIPTION OF THE PREFERRED EMBODIMENTS

Preferred embodiments according to the present invention will be described in detail below with reference to the accompanying drawings.

First Embodiment

Figure 1:
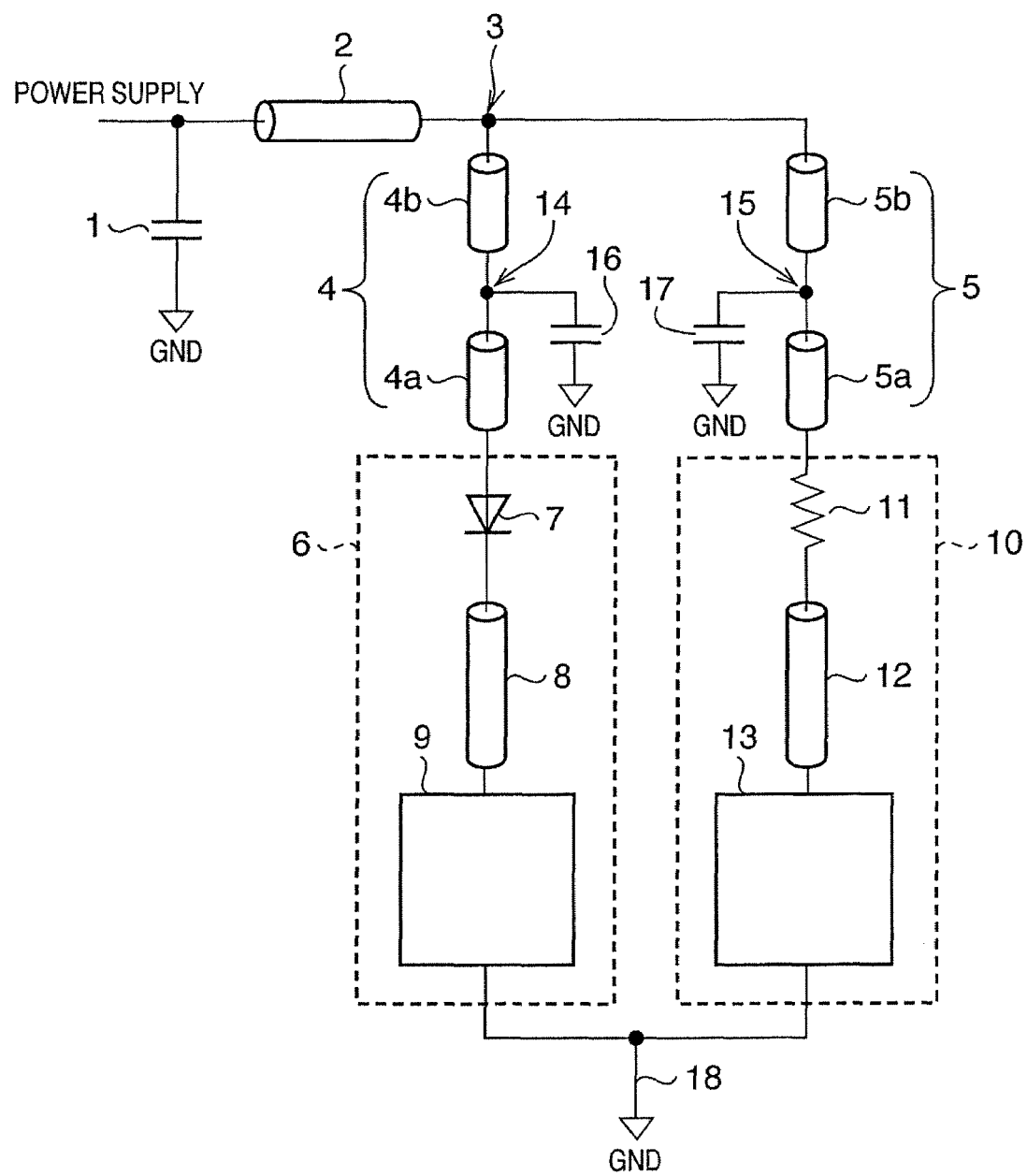
FIG. 1 is a circuit diagram showing the arrangement of a laser circuit substrate on which a semiconductor laser driver according to the first embodiment of the present invention is mounted.

FIG. 1 is a circuit diagram showing the arrangement of a laser circuit substrate on which a semiconductor laser driver according to the first embodiment of the present invention is mounted.

Referring to FIG. 1, reference numeral 1 denotes a feed capacitor; and 2, main power transmission wiring. A first capacitor 16 is attached to first wiring 4 at a first arrangement point 14. The first wiring 4 is divided into third wiring 4a and fourth wiring 4b at the first arrangement point 14. A second capacitor 17 is attached to second wiring 5 at a second arrangement point 15. The second wiring 5 is divided into fifth wiring 5a and sixth wiring 5b at the second arrangement point 15. The first wiring 4 and second wiring 5 are connected in parallel at a branch point 3 of the main power transmission wiring 2.

A light-emitting circuit 6 connected to the first wiring 4 is made up of a semiconductor laser element 7, seventh wiring 8, and driving semiconductor device 9. A compensation circuit 10 connected to the second wiring 5 is made up of a compensation element 11, eighth wiring 12, and compensation semiconductor device 13. The light-emitting circuit 6 and compensation circuit 10 are also connected in parallel and connected to a ground wiring pattern.

With the arrangement shown in FIG. 1, the first and second capacitors 16 and 17 are arranged at the first and second arrangement points 14 and 15, respectively. At this time, the positions of the first and second arrangement points 14 and 15 are set such that the impedance of the light-emitting circuit 6 side viewed from the first arrangement point 14 is almost equal to that of the compensation circuit 10 side viewed from the second arrangement point 15. Note that the first and second capacitors 16 and 17 adopt capacitors having the same or almost the same capacitance.

With this arrangement, the compensation circuit 10 and the light-emitting circuit 6 are complementarily driven, thus implementing a compensation function of allowing the feed capacitor 1 to supply a constant current. Since the current which flows through the main power transmission wiring 2 can be made constant, noise currents which normally flow through the main power transmission wiring 2 can be suppressed. In addition, noise currents generated in the light-emitting circuit 6 are canceled by a compensation current flowing through the compensation circuit at the branch point 3 of the first wiring 4 (4a and 4b) and second wiring 5 (5a and 5b). This makes it possible to suppress propagation of the noise currents to the main wiring side.

In order to explain effects obtained in this embodiment, simulation results are shown in FIGS. 3 to 6. In this case, the lengths of the respective wiring are set as follows:

main power transmission wiring 2: 5 mm
third wiring 4a: 5 mm
fourth wiring 4b: 5 mm
fifth wiring 5a: 5 mm
sixth wiring 5b: 10 mm
seventh wiring 8: 2 mm
eighth wiring 9: 2 mm The feed capacitor 1 has a capacitance of 0.2 µF. The semiconductor laser element 7 is DL3038 (manufactured by Sanyo Electric Corp.). The compensation element 11 has a resistance of 10Ω. The light-emitting circuit driving semiconductor element 9 and compensation circuit driving semiconductor element 13 are M61881FP (manufactured by Mitsubishi Electric Corp.). The additional first and second capacitors 16 and 17 have a capacitance of 0.1 µF.

Figure 2:
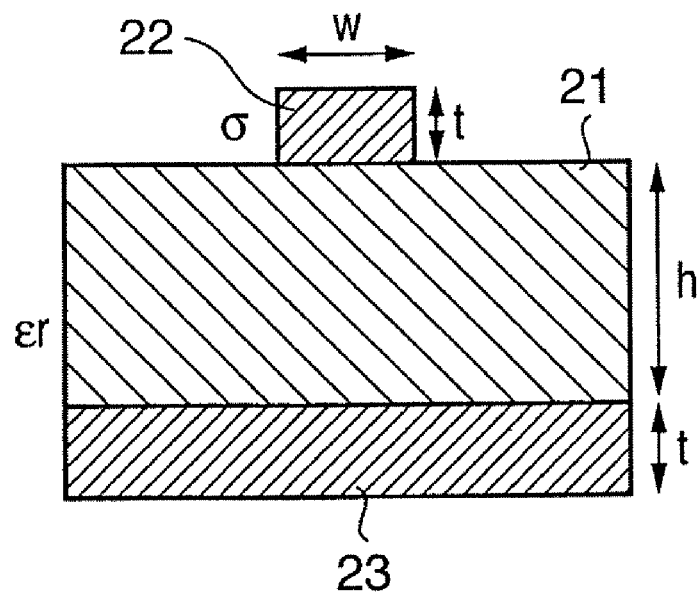
FIG. 2 is a sectional view of the laser circuit substrate.

FIG. 2 shows the arrangement of wiring which connect the above parts. For the sake of easy understanding, the wiring patterns have the same arrangement, but have different lengths. Referring to FIG. 2, a substrate main body 21 has a thickness of h=1.43 mm and is formed of an insulator. A wiring pattern 22 is formed of a conductor having a thickness of $t_1$=35 μm, width of w=2.7 mm, and conductivity of σ=5.8*10$^7$, and is arranged on the upper surface of the substrate main body 21. A conductor layer 23 has a thickness of $t_2$=35 μm and is arranged on the lower surface of the substrate main body 21. The driving frequency of the semiconductor laser element is 60 MHz.

Figure 3:
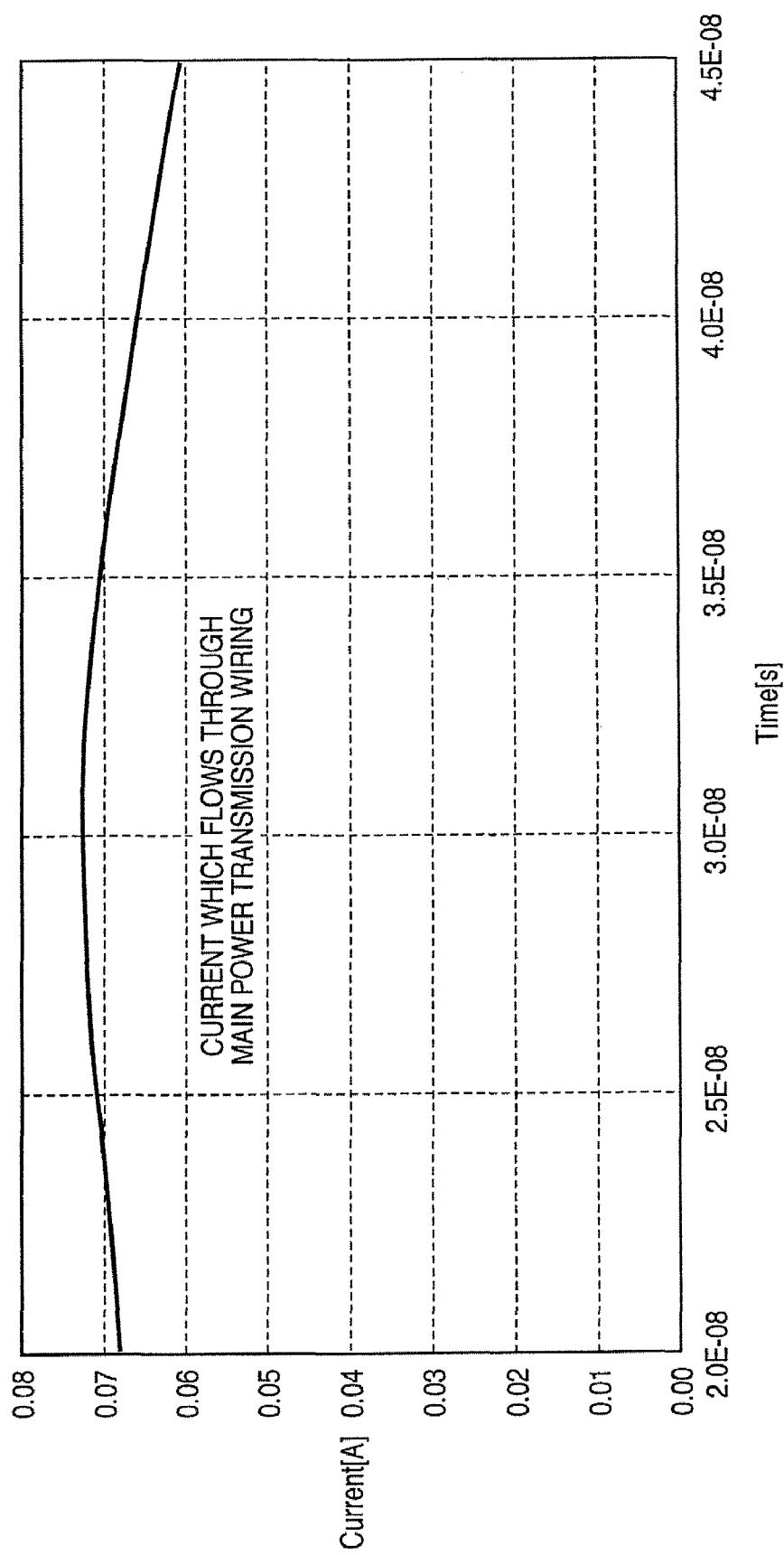
FIG. 3 is a graph showing a time change in a current which flows through main power transmission wiring in the first embodiment.
Figure 4:
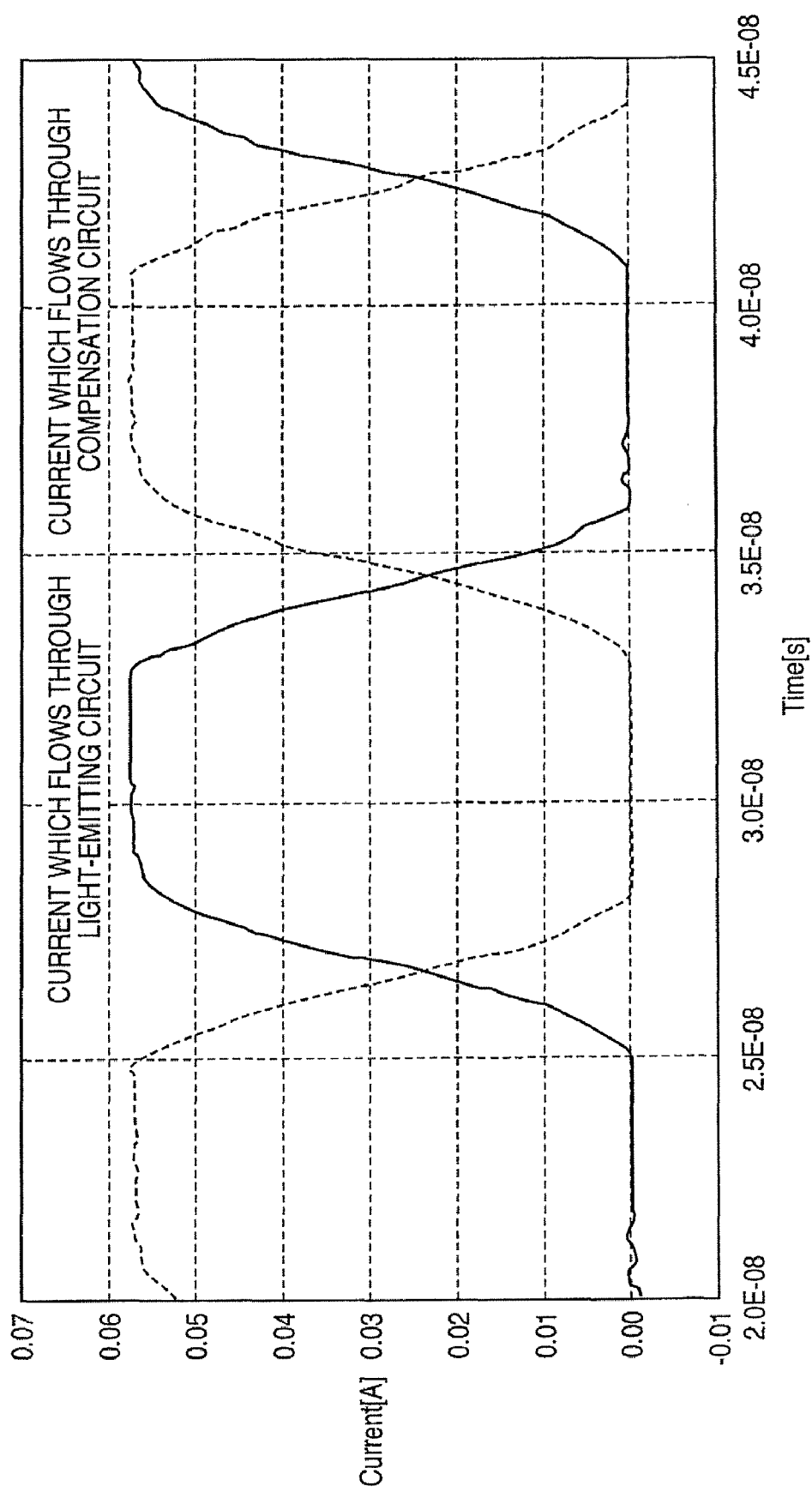
FIG. 4 is a graph showing time changes in currents which flow through a light-emitting circuit and compensation circuit in the first embodiment.

FIGS. 3 and 4 show results obtained by simulating a current which flows through the main power transmission wiring 2 in the arrangement of the above-described embodiment. FIG. 3 shows the current which flows through the main power transmission wiring. FIG. 4 shows currents which flow through the light-emitting circuit 6 and compensation circuit 10.

Figure 5:
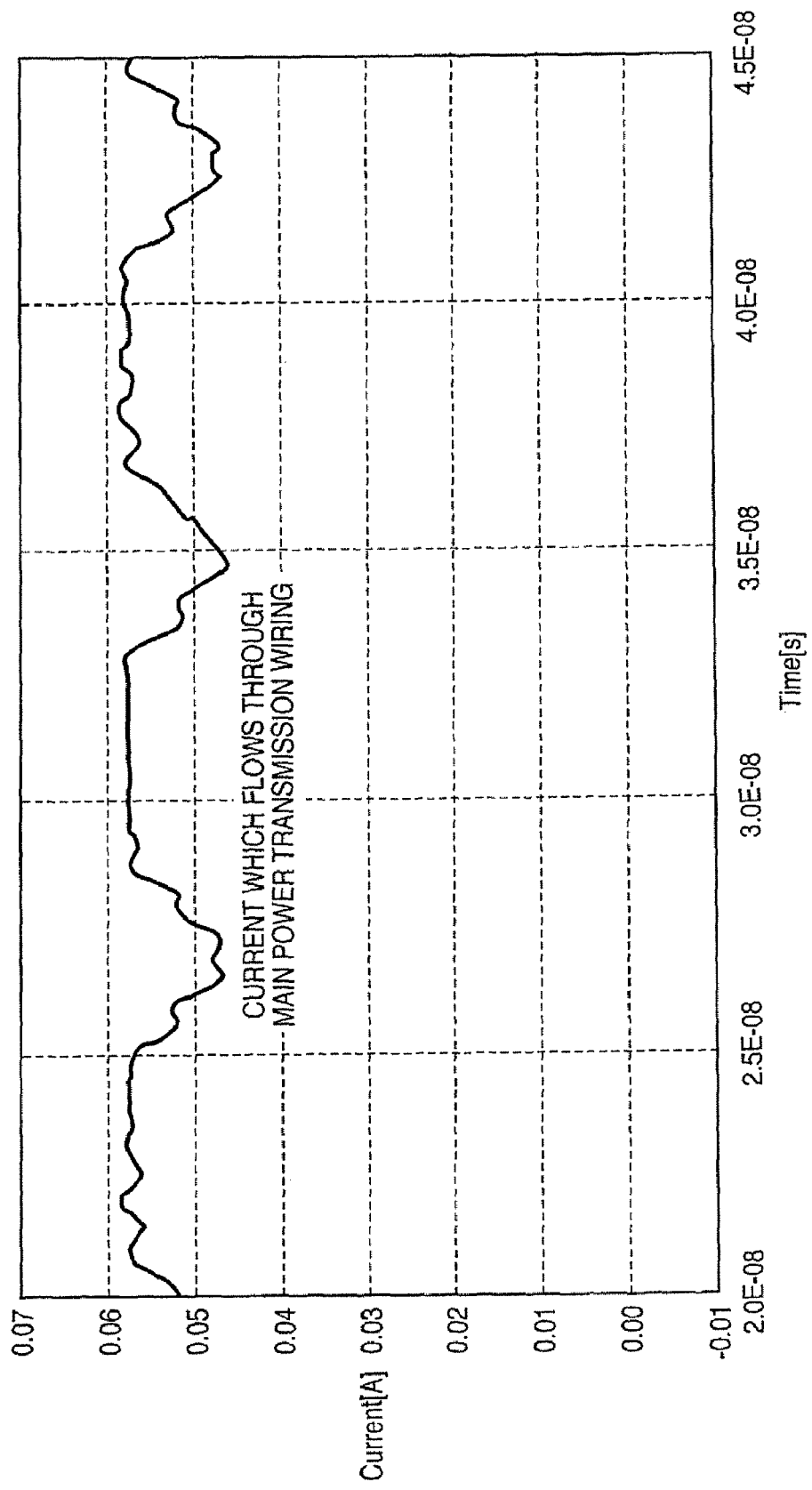
FIG. 5 is a graph showing a time change in a current which flows through main power transmission wiring in the prior art.
Figure 6:
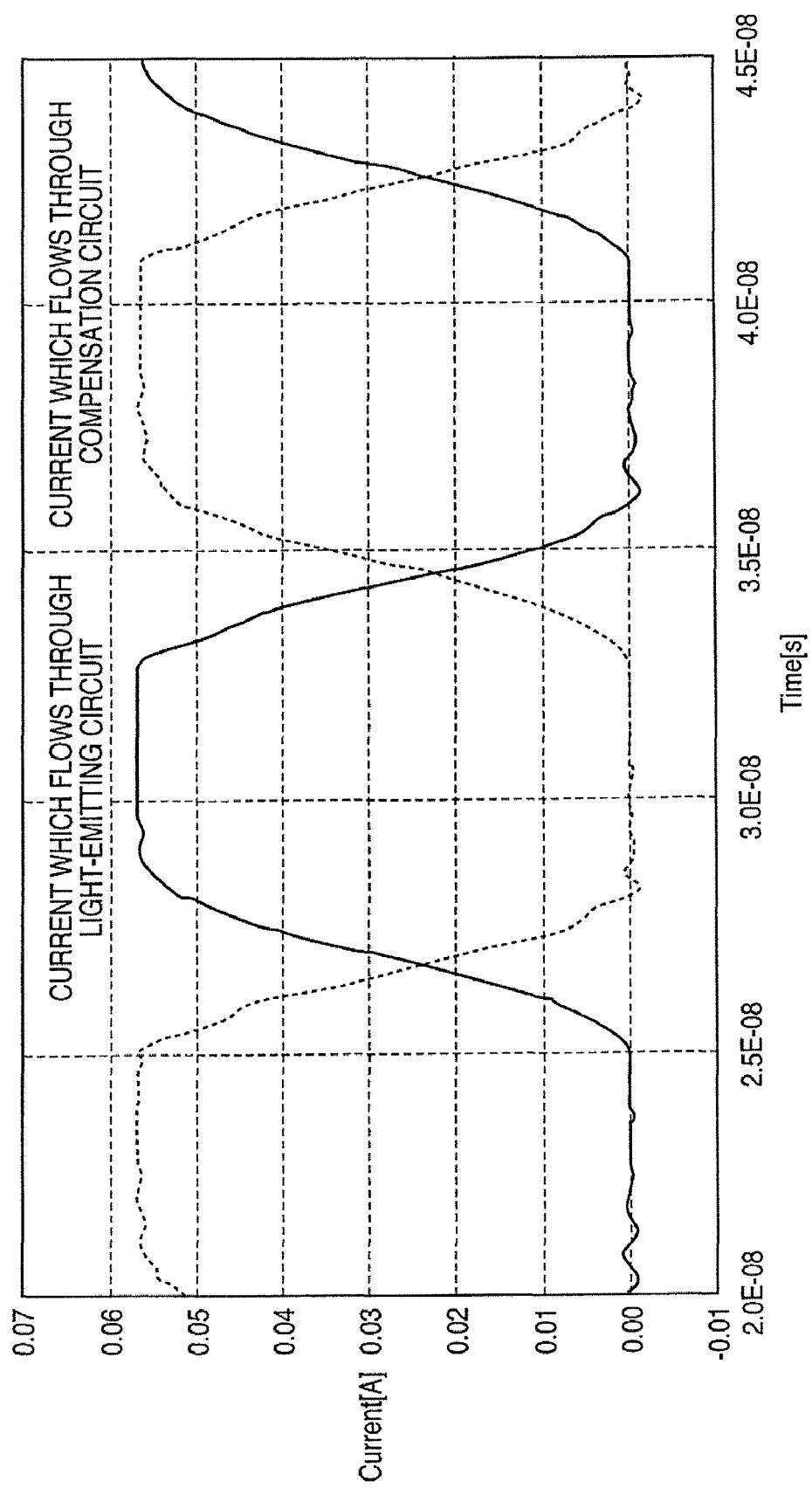
FIG. 6 is a graph showing time changes in currents which flow through a light-emitting circuit and compensation circuit in the prior art.
Figure 9:
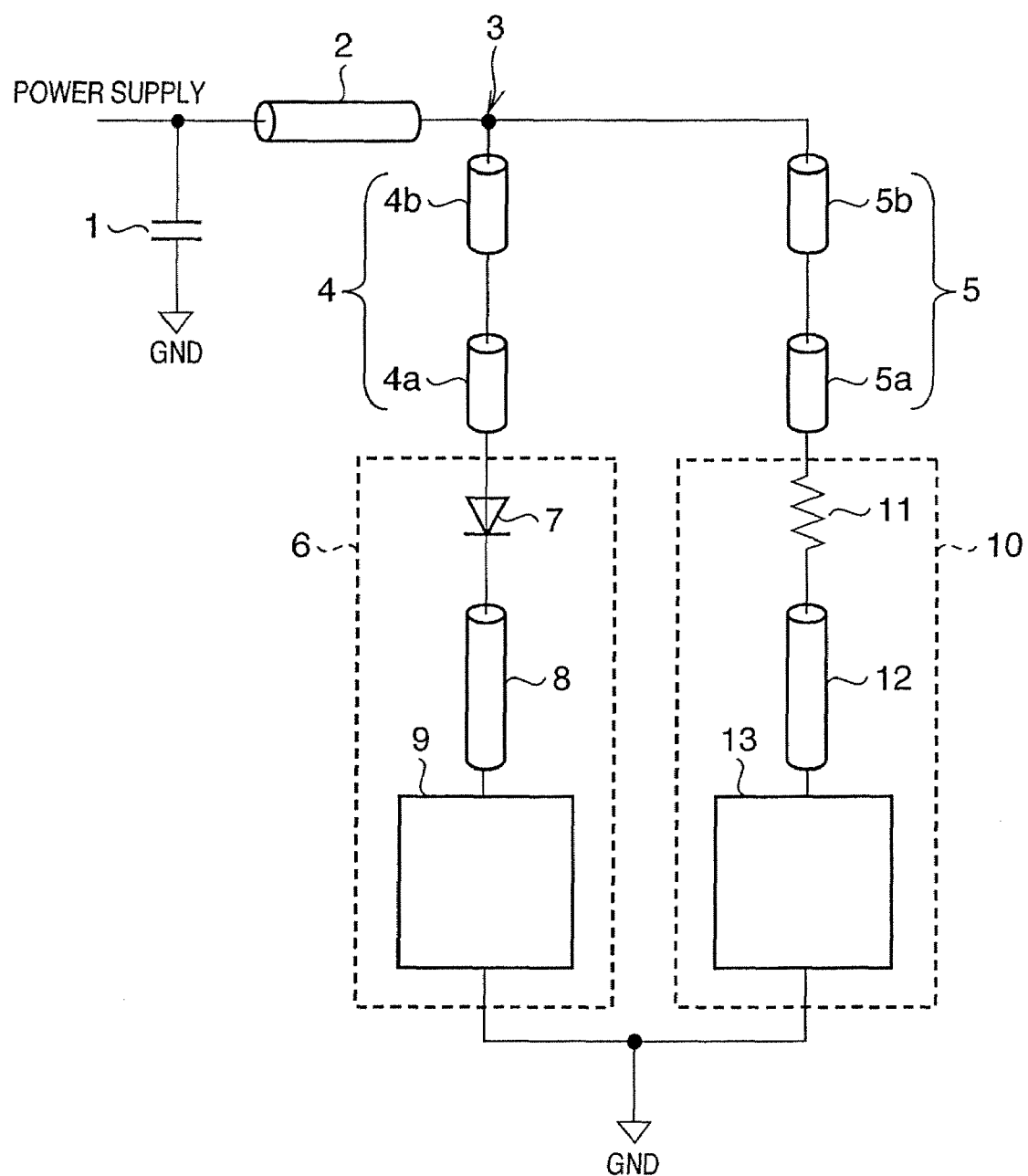
FIG. 9 is a circuit diagram showing the arrangement of a laser circuit substrate on which a conventional semiconductor laser driver is mounted.

FIGS. 5 and 6 show results obtained by simulating a current which flows through main power transmission wiring in the conventional arrangement shown in FIG. 9. FIG. 5 shows the current which flows through the main power transmission wiring. FIG. 6 shows currents which flow through a light-emitting circuit and compensation circuit.

When the data shown in FIGS. 3 and 5 are compared, it is understood that the arrangement of this embodiment indicates a smoother current characteristic in which noise currents rarely appear as compared with the conventional arrangement shown in FIG. 9. When the data shown in FIGS. 4 and 6 are compared, it is also understood that the arrangement of this embodiment indicates, even at the leading edge/trailing edge of a signal, a smoother current characteristic in which noise currents rarely appear as compared with the conventional arrangement shown in FIG. 9.

With the conventional arrangement shown in FIG. 9, the length (5 mm) of the fourth wiring 4b of the first wiring 4 is different from the length (10 mm) of the sixth wiring 5b of the second wiring 5. Furthermore, an impedance Z6 of the light-emitting circuit 6 is not necessarily equal to an impedance Z10 of the compensation circuit 10. This causes the difference between an impedance (Z4a+Z4b+Z6) resulting from the first wiring 4 and light-emitting circuit 6, and an impedance (Z5a+Z5b+Z10) resulting from the second wiring 5 and compensation circuit 10. Hence, the compensation function of the compensation circuit degrades, and noise currents occur.

This causes the difference between the sum of the impedances (Z4a+Z4b) of the third wiring 4a and fourth wiring 4b, and the sum of the impedances (Z5a+Z5b) of the fifth wiring 5a and sixth wiring 5b. Hence, the compensation function of the compensation circuit degrades, and noise currents occur.

Moreover, assume that the impedance Z6 of the light-emitting circuit 7 is almost equal to the impedance Z10 of the compensation circuit 10. In this case, impedances $Z_{Laser}$ and $Z_{Comp}$ are largely different from each other due to the difference between the lengths of the first wiring 4 and second wiring 5.

Hence, the compensation function of the compensation circuit 10 degrades, so the noise currents generated on the light-emitting circuit 6 side are not canceled, and propagate to the main power transmission wiring 2. For this reason, as shown in FIG. 5, noise components are generated in the current flowing through the main power transmission wiring.

The relationship among the impedances in the conventional arrangement shown in FIG. 9 is given by:

$Z_{Laser}$=Z4a+Z4b+Z6

$Z_{Comp}$=Z5a+Z5b+Z10

In this case, if the length of the first wiring 4 (4a and 4b) is equal to that of the second wiring 5 (5a and 5b), the compensation function of the compensation circuit 10 naturally improves. Since noise currents to be canceled increase, noise currents obviously decrease. However, as described above, the degree of freedom of wiring is becoming regulated in recent years. Under such a circumstance, it is difficult to set the length of the first wiring 4 (4a and 4b) to be equal to that of the second wiring 5 (5a and 5b).

To the contrary, the relationship among the impedances in this embodiment shown in FIG. 1 is given by:

$Z_{Laser}'$=Z4a+Z6

$Z_{Comp}'$=Z5a+Z10

In this case, the arrangement points 14 and 15 are set such that the sum of the impedances $Z_{Laser}'$ of the third wiring 4a and light-emitting circuit 6 viewed from the arrangement point 14 is equal to the sum of the impedances $Z_{Comp}'$ of the fifth wiring 5a and compensation circuit 10 viewed from the arrangement point 15. The first and second capacitors 16 and 17 are connected to the arrangement points 14 and 15, respectively. Note that a terminal on the opposite side of the connection point between the first capacitor 16 and arrangement point 14 is connected to a ground wiring pattern. A terminal on the opposite side of the connection point between the second capacitor 17 and arrangement point 15 is connected to a ground wiring pattern.

In this manner, the compensation function of the compensation circuit effectively functions by setting the values $Z_{Laser}'$ and $Z_{Comp}'$ to be almost equal to each other to prevent the occurrence of noise currents. Moreover, assume that the impedance Z6 of the light-emitting circuit 6 is almost equal to the impedance Z10 of the compensation circuit 10. Even in this case, the values $Z_{Laser}'$ and $Z_{comp}'$ can always be kept almost equal to each other by adjusting the positions of the arrangement points 14 and 15.

Figure 7:
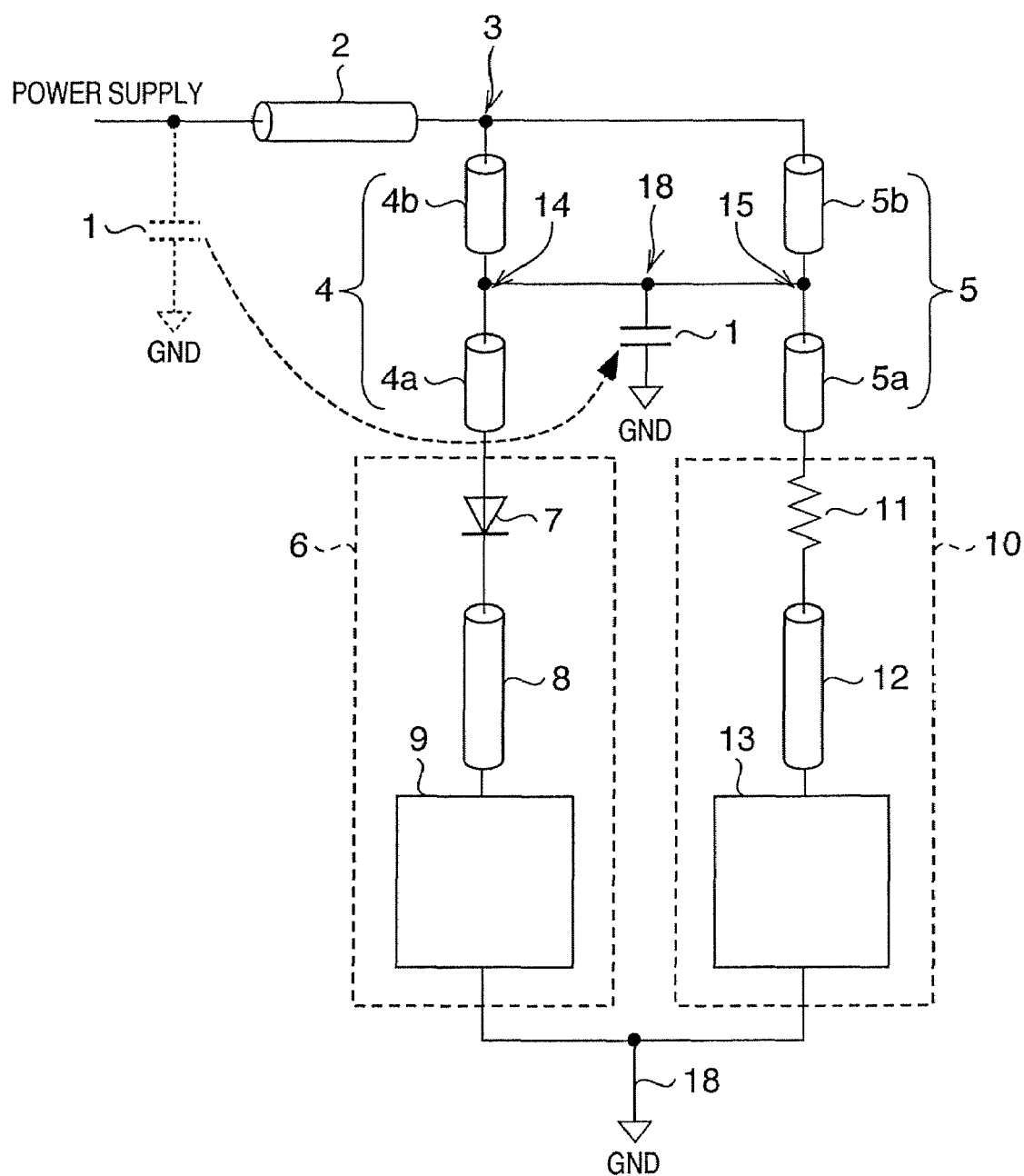
FIG. 7 is a circuit diagram conceptually showing a virtual arrangement point in the first embodiment.

In the conventional arrangement shown in FIG. 9, the feed capacitor 1 supplies a necessary amount of currents to the light-emitting circuit 6 and compensation circuit 10. However, in this embodiment, since the first and second capacitors 16 and 17 are inserted into the circuitry, the first and second capacitors 16 and 17 supply currents to the light-emitting circuit 6 and compensation circuit 10, respectively. This state is equivalent to that set by moving the feed capacitor 1 to a virtual arrangement point 18, which is determined by virtually short-circuiting the arrangement points 14 and 15 as shown in the conceptual view of the virtual arrangement points in FIG. 7.

In addition, the sum of the impedances $Z_{Laser}'$ of the third wiring 4a and light-emitting circuit 6 is almost equal to that of the impedances $Z_{Comp}'$ the fifth wiring 5a and compensation circuit 10. For this reason, when viewed from the virtual arrangement point 18, the impedance of the light-emitting circuit 6 side is almost equal to that of the compensation circuit 10 side. Hence, it can be considered that the feed capacitor 1 is equivalently arranged at the point 18 where the impedances of the light-emitting circuit 6 side and compensation circuit 10 side are equal to each other.

In the conventional arrangement, the arrangement point of the capacitor 1 is determined in accordance with two wiring restrictions by $Z_{Laser}$ and $Z_{Comp}$, so the degree of freedom of wiring remarkably decreases. This makes it difficult to give the same value to $Z_{Laser}$ and $Z_{Comp}$ in wiring. However, in this embodiment, the arrangement point of the first capacitor 16 is determined in accordance with the wiring restriction by $Z_{Laser}$ alone, and the arrangement point of the second capacitor 17 is determined in accordance with the wiring restriction by $Z_{Comp}$ alone. Therefore, even if the degree of freedom of wiring remarkably decreases, the same value can be given to $Z_{Laser}'$ and $Z_{Comp}'$ in wiring. Hence, this amounts to increasing the degree of freedom of wiring.

In addition, since the conventional arrangement remarkably decreases the degree of freedom of wiring, it is difficult to perform isometric wiring. However, when the virtual arrangement point 18 is determined as in this embodiment, the degree of freedom of wiring can be equivalently increased, thus virtually realizing isometric wiring.

According to this embodiment, the compensation function of the compensation circuit 10 can be improved to promote the cancellation effect of noise currents, thereby greatly reducing noise components generated in the current flowing through the main power transmission wiring, as shown in FIG. 4. Accordingly, radiant noise generated when a power supply cable serves as an antenna can be reduced.

Note that the difference between the impedances $Z_{Laser}$ and $Z_{Comp}$ is generated due to not only the difference in wiring length but also the shapes of wiring. Therefore, even if the difference in impedance is generated mainly due to the shapes of wiring, the same effect can be obtained by arranging the first and second capacitors 16 and 17 at the arrangement points 14 and 15, respectively, where the impedances of the light-emitting circuit 6 side and compensation circuit 10 side are almost equal to each other.

As described above, according to the first embodiment, high-speed and high-quality image printing and radiant noise reduction can be simultaneously attained.

Second Embodiment

Figure 8:
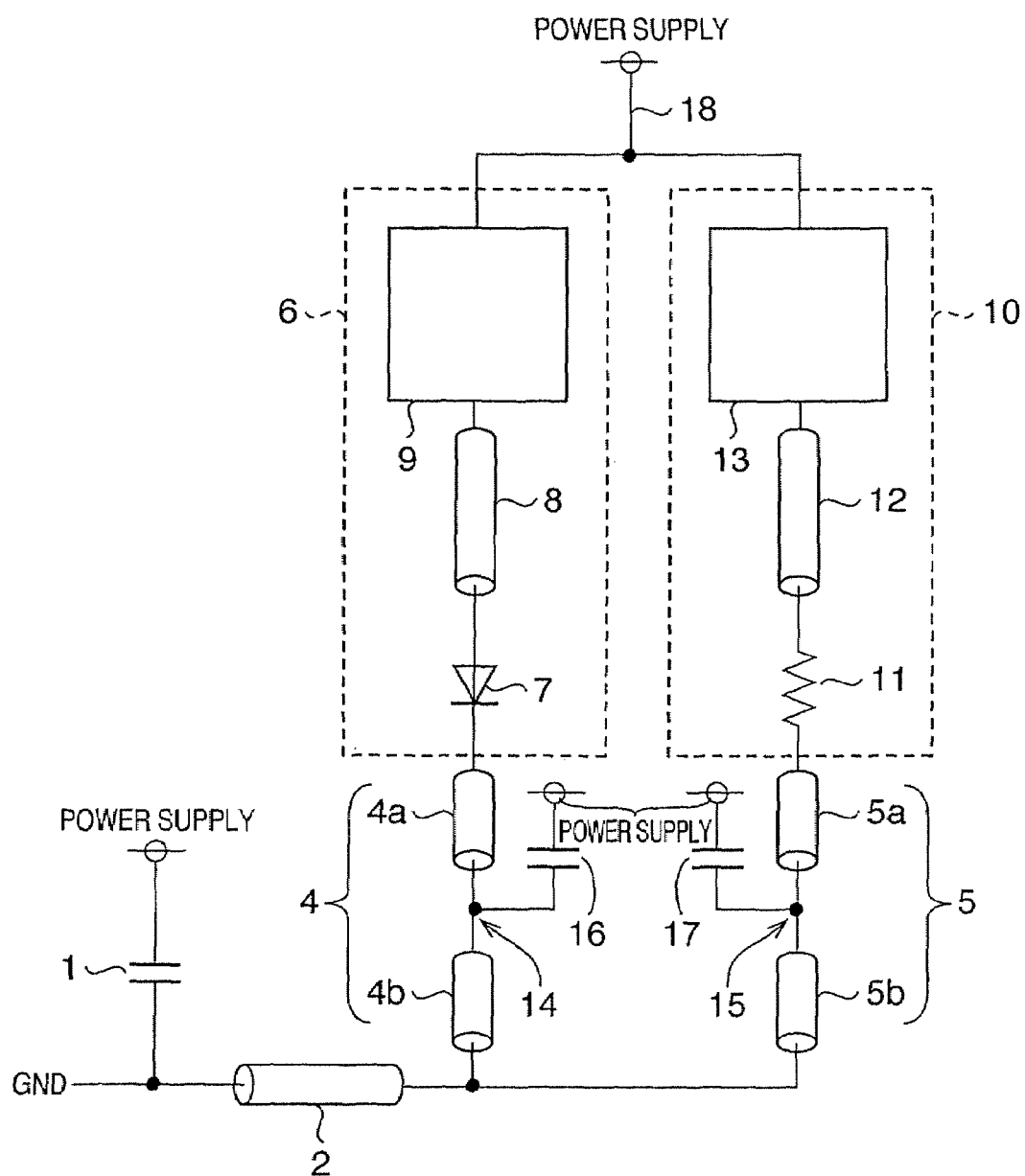
FIG. 8 is a circuit diagram showing the arrangement of a laser circuit substrate on which a semiconductor laser driver according to the second embodiment of the present invention is mounted.

The first embodiment has been described by taking the main power transmission wiring as an example of the main wiring. However, as shown in FIG. 8, even if main ground wiring is used as the main wiring, the same effect as in the first embodiment can be obtained by arranging the first and second capacitors 16 and 17 at the arrangement points 14 and 15, respectively, where the impedances of the light-emitting circuit 6 side and compensation circuit 10 side are almost equal to each other.

As described above, according to the above embodiments, even if a printed board having a remarkably low degree of freedom of wiring is used, the degree of freedom of wiring can be equivalently increased.

In addition, when the above embodiments are applied to a printed circuit board for driving a semiconductor laser in a laser beam printer, a requirement of high-speed and high-quality image printing can be satisfied while realizing radiant noise reduction.

The present invention is not limited to the above embodiments and various changes and modifications can be made within the spirit and scope of the present invention. Therefore, to apprise the public of the scope of the present invention the following claims are made.

CLAIM OF PRIORITY

This application claims priority from Japanese Patent Application No. 2004-364773 filed on Dec. 16, 2004, and No. 2005-326594 filed on Nov. 10, 2005, which are hereby incorporated by reference herein.

What is claimed is:

1. A laser circuit substrate comprising:
    a main ground wiring pattern;
    a power transmission wiring pattern;
    a first wiring pattern and second wiring pattern which are connected in parallel with each other from said main ground wiring pattern;
    a first circuit which is connected between said first wiring pattern and ground wiring pattern and has a semiconductor laser element and a driving circuit for driving said semiconductor laser element; and
    a second circuit which is connected between said second wiring pattern and ground wiring pattern and has a compensation element and driving device of the compensation element,
    wherein said first circuit is a light-emitting circuit for making the semiconductor laser element emit light, and said second circuit is a compensation circuit which has an electric characteristic equal to an electric characteristic of said light-emitting circuit and the compensation circuit is complementarily driven with said light-emitting circuit,
    said first wiring pattern is divided at a first point into a third wiring pattern and fourth wiring pattern from a first circuit side, and a first capacitor is connected to the first point,
    said second wiring pattern is divided at a second point into a fifth wiring pattern and sixth wiring pattern from a second circuit side, and a second capacitor is connected to the second point, and
    a sum of impedances of said first circuit and third wiring pattern is set to be substantially equal to a sum of impedances of said second circuit and fifth wiring pattern.

2. The substrate according to claim 1, wherein a terminal of said first capacitor, which is opposite to a terminal connected to said first wiring pattern, and a terminal of said second capacitor, which is opposite to a terminal connected to said second wiring pattern are connected to said power transmission wiring pattern.

3. The substrate according to claim 1, wherein capacitances of said first capacitor and second capacitance are substantially equal to each other.

* * * * *